(12) United States Patent
Rumney

(10) Patent No.: US 6,752,276 B2
(45) Date of Patent: Jun. 22, 2004

(54) PCI CARD SUPPORT

(75) Inventor: Gary Rumney, Leighton Buzzard (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/217,158

(22) Filed: Aug. 12, 2002

(65) Prior Publication Data

US 2004/0026345 A1 Feb. 12, 2004

(51) Int. Cl.$^7$ .................................................. A47F 5/00
(52) U.S. Cl. .................... 211/41.17; 361/683; 361/759; 361/801
(58) Field of Search ........................ 211/41.17; 361/683, 361/470, 759, 801, 802

(56) References Cited

U.S. PATENT DOCUMENTS

| | | | |
|---|---|---|---|
| 4,198,024 A | * | 4/1980 | Cavanna .............. 211/41.17 X |
| 5,291,368 A | | 3/1994 | Conroy-Wass |
| 5,383,793 A | * | 1/1995 | Hsu et al. ............... 361/801 X |
| 5,445,450 A | | 8/1995 | Hayes et al. |
| 5,457,608 A | * | 10/1995 | Scholder et al. ........ 361/759 X |
| 5,603,628 A | * | 2/1997 | Schapiro ................ 361/759 X |
| 5,754,406 A | * | 5/1998 | Hardt et al. ............ 361/759 X |
| 5,822,193 A | * | 10/1998 | Summers et al. .......... 361/759 |
| 5,996,962 A | * | 12/1999 | Chang et al. ........... 361/759 X |
| 6,021,049 A | * | 2/2000 | Thompson et al. ... 211/41.17 X |
| 6,181,565 B1 | * | 1/2001 | Schmitt et al. ....... 211/41.17 X |
| 6,381,149 B1 | * | 4/2002 | Megason et al. ....... 361/802 X |
| 6,442,037 B1 | * | 8/2002 | Boe .......................... 361/759 |

* cited by examiner

Primary Examiner—Robert W. Gibson, Jr.
(74) Attorney, Agent, or Firm—Meyertons Hood Kivlin Kowert & Goetzel, P.C.; B. Noël Kivlin

(57) ABSTRACT

There is described a support rail and a support element for engaging an edge of an expansion card mounted in a circuit housing, wherein the support element is fixable in a selected position along the length of the support rail by engagement of a detent on the support element and a facing abutment surface on the rail.

7 Claims, 5 Drawing Sheets

PCI CARD SUPPORT

BACKGROUND OF THE INVENTION

The present invention relates to rack-mountable modular electronic circuits, and is primarily concerned with providing a supporting element for a circuit card such as a sound modem or graphics card mounted in a modular circuit housing. Specifically, the invention is concerned with a support element movable on a rail to engage cards of different dimensions.

In electronic circuits such as computers and servers, a motherboard supports the main processing components and provides electrical connections thereto and to ancillary components such as power supplies, disc drives etc. The motherboard is often also provided with "expansion slots", which are edge connectors electrically connected to the motherboard wiring and into which circuit boards may be inserted to augment the functionality of the circuit. Sound cards, graphics cards and modems are examples of the circuit boards which may be put into the expansion slots.

Since the cooling components of the circuit generate mechanical vibration, the service life of the expansion boards is increased if the boards are supported both at their edge connector and at a point remote from the edge connector. This multi-point support reduces the vibrational flexing of the circuit board and prevents damage to components and wiring tracks caused by flexing.

Expansion boards are commercially produced in different sizes, and thus to effectively support any of the boards which may be put into an expansion slot it is necessary to arrange for a support at one of a number of different locations relative to the edge connector. A solution to this problem is to provide a rail along which a support may be moved to suit the dimensions of the expansion board, and a clamp arrangement to clamp the support at the required position. However, the vibration which necessitates the support also can loosen the clamp and lead to unwanted movement of the support and the expansion board.

SUMMARY OF THE INVENTION

An aspect of the present invention provides a support assembly for a circuit board wherein a support element is movable along a support rail and is selectively fixable at one of a plurality of fixing points along the rail by engagement of a detent on the support element and a longitudinally-facing abutment surface on the rail.

Another aspect of the invention provides a support assembly wherein a rail has a plurality of recesses spaced along its length and the support element has a bolt engageable with a selected one of the recesses to fix the support element in a longitudinal position relative to the rail. In one particular embodiment, the bolt is resiliently biased toward an extended, recess-engaging, position and is manually retractable to a released position.

Another aspect of the invention provides a housing for an electronic circuit wherein the housing comprises a support rail having number of longitudinally-facing abutment surfaces.

Further aspects provide a rack-mountable circuit module having such a housing, and a rack-mounted electronic circuit consisting of a number of such modules.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Figure 1:
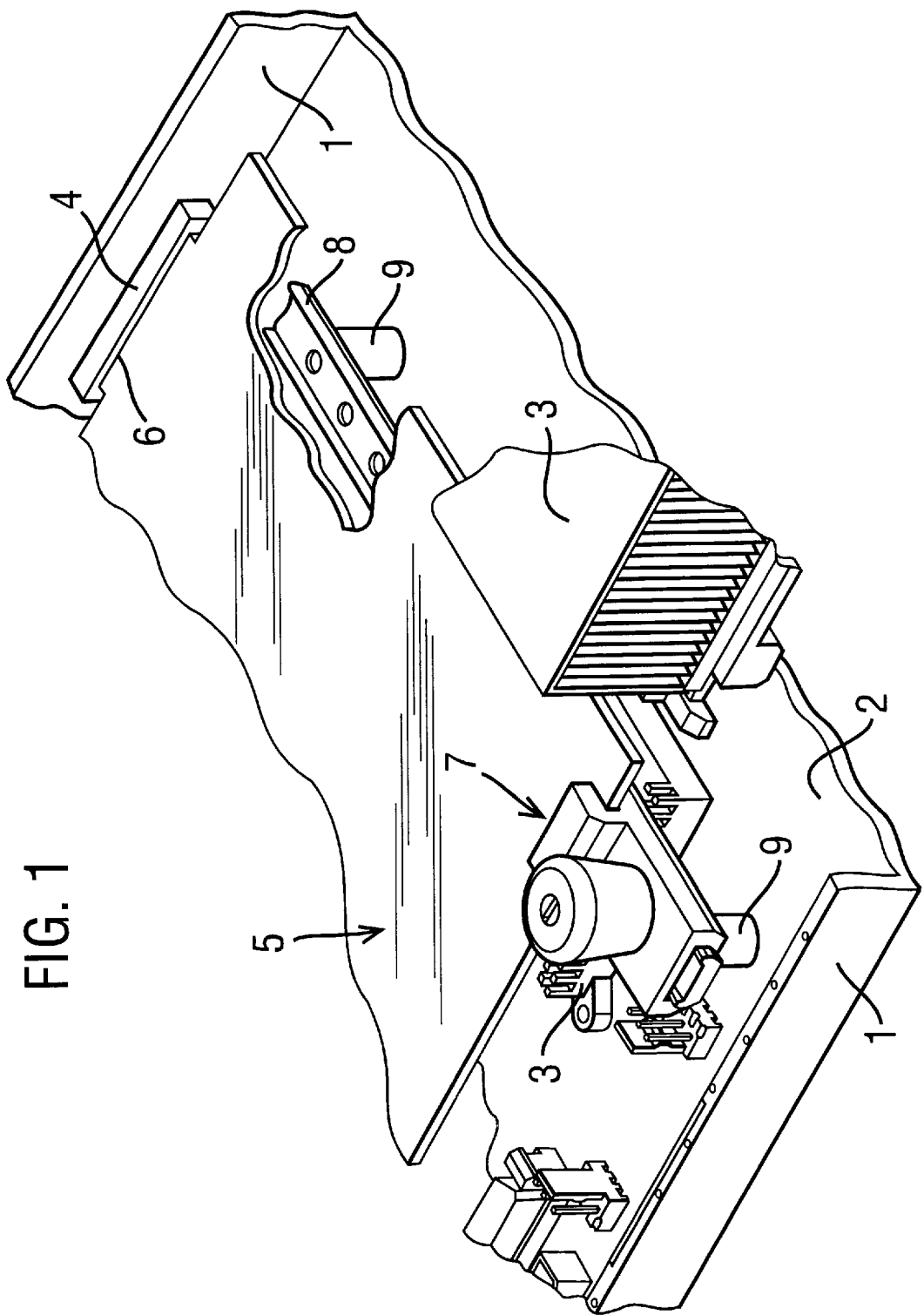
FIG. 1 is a perspective view showing a part of the interior of a circuit housing.

Referring now to the drawings, in which like reference numerals are used to designate corresponding elements, FIG. 1 is a perspective view of parts of a circuit housing and circuit components mounted therein.

In FIG. 1, the housing comprises sidewalls 1 and a baseplate 2, on which components 3 are mounted to perform circuit functions. On one of the sidewalls 1, an edge connector 4 is provided to serve as an "expansion slot" for the main circuit. A circuit board 5 is provided with an edge connection 6 insertable into a slot of the edge connector 4.

In order to support the edge of the circuit board 5 remote from the edge connector 6, a support element 7 is provided. The support element 7 is mounted on a support rail 8 which is mounted to the baseplate 2 by means of pillars 9. The support rail 8 extends in a direction away from the edge connector 4.

Figure 2:
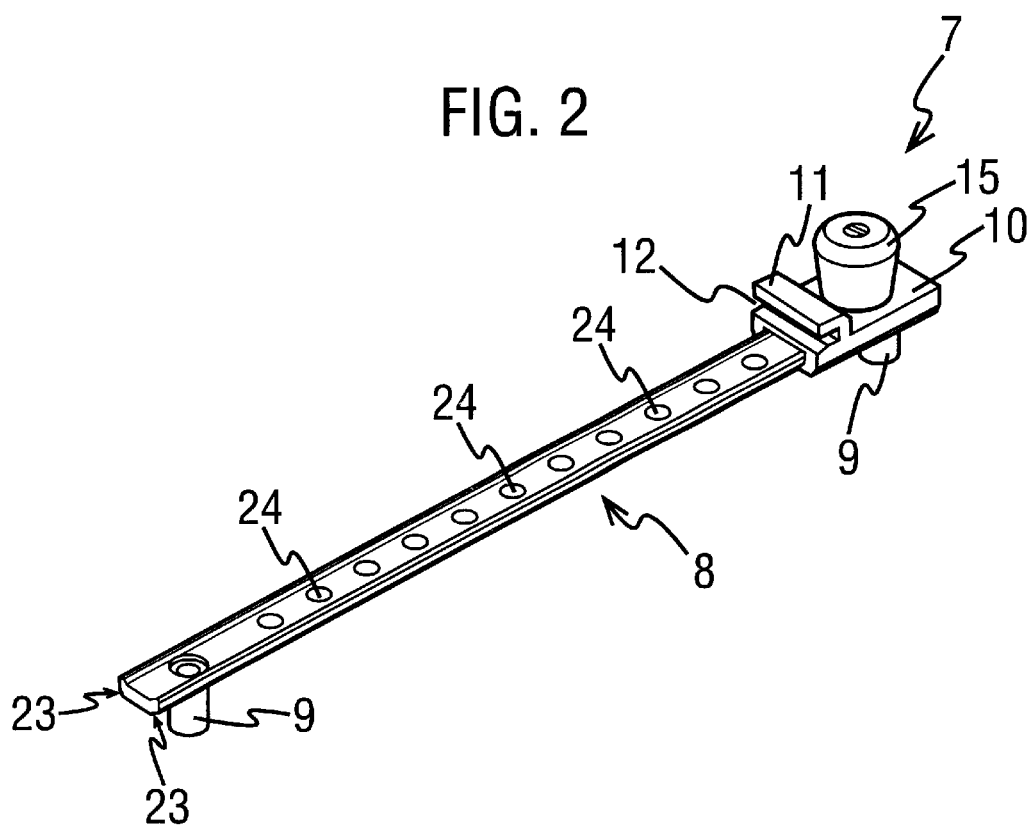
FIG. 2 is a perspective view of a circuit board support mounted on a rail.
Figure 3:
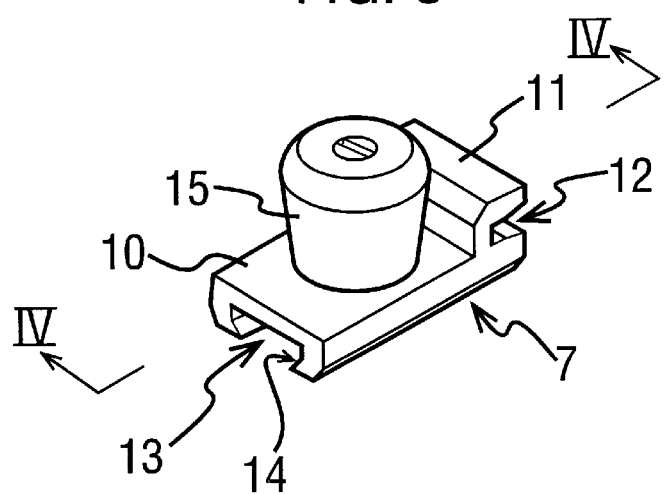
FIG. 3 is a perspective view of the circuit board support element.
Figure 4:
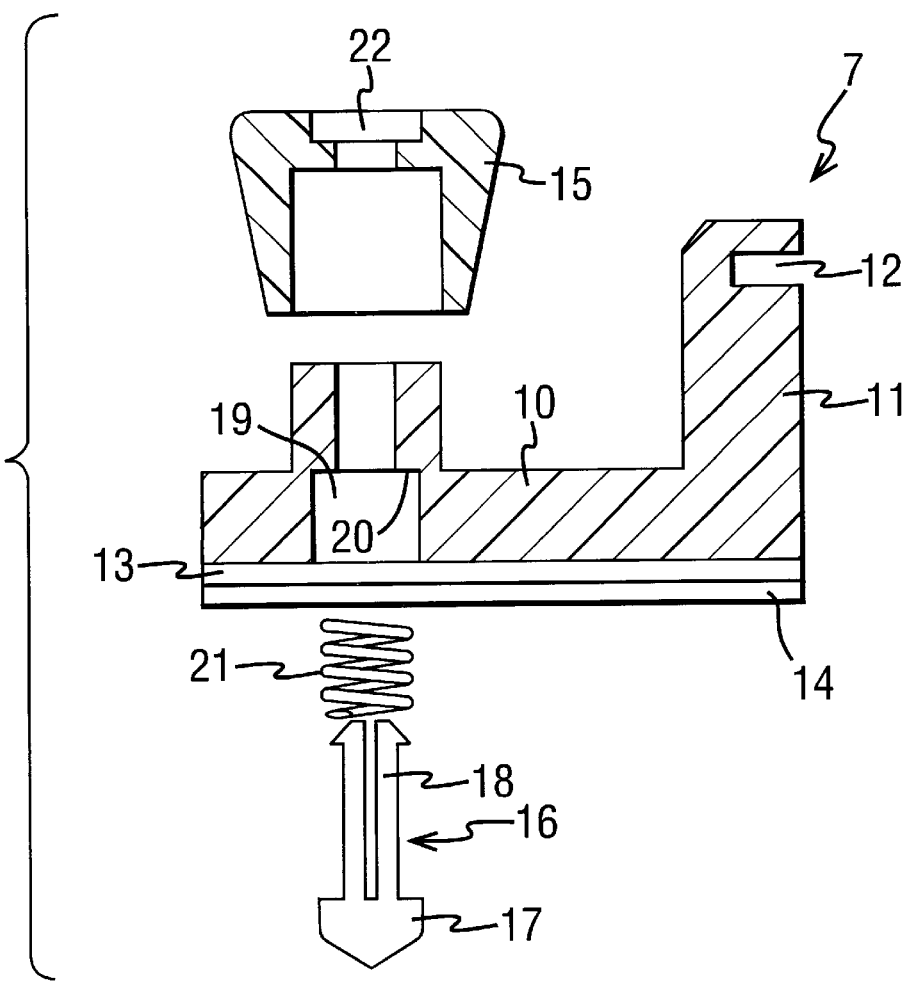
FIG. 4 is a longitudinal sectional view of the support element of FIG. 3 in the plane IV—IV.

A support rail 8 and support element 7 are shown in greater detail in FIGS. 2 to 4.

The support element 7 comprises a main body 10 having an upstand 11 at one end. An engagement slot 12 is formed in the upper part of the upstand, facing away from the main body 10.

An undercut slot 13 extends along the lower surface of the lower surface of the main body 10 right angles to the engagement slot 12, the edge regions 14 of the undercut slot being angled inwardly.

An operating button 15 is mounted to the upper surface of the main body 10. A bolt 16 having an enlarged head 17 and a shank 18 extends upwardly through a stepped bore 19 in the main body 10. The stepped bore 19 has a downwardly facing shoulder 20, and a spring 21 is held captive around the shank 18 between the shoulder 20 and the head 17 of the bolt 16. The upper end of the shank 18 extends outwardly from the stepped bore 19 and engages a counter-bored hole 22 in the button 15, to secure the shank 18 of the bolt 16 to the button 15. The spring 21 urges the bolt 16 downwardly (as seen in FIG. 4) while an upward pull on the button 15 raises the bolt 16 to a position where the bolt head 17 is within the main body 10 of a support element 7.

The support rail 8 has a cross-section complementary to that of the undercut slot 13, so that the support element 7 can move along the support rail 8. The inclined edge regions 14 of the undercut slot 13 engage with inclined surfaces 23 of the support rail 8. The support rail 8 is provided with pillars 9 at its ends, extending from the undersurface of the rail 8 to support the rail 8 in a spaced relationship from a supporting structure such as base plate 2. The pillars 9 are dimensioned so as to be able to pass between the edge regions 14 of the support element 7.

A series of recesses 24 are formed along the length of the upper surface of the rail 8, the shapes of the recesses 24 being complementary with the shape of the end surface of the head 17 of the bolt 16 in the support element 7. The recesses 24 may be depressions in the upper surface of the rail 8 or may be holes penetrating through the rail 8.

In use, the rail 8 is mounted to the housing of the circuit so as to extend away from the edge connector 4 which receives the circuit board 5. The support element 7 is then positioned with its undercut slot 13 aligned with the end of the rail 8 remote from the edge connector 4, and the support element 7 is then advanced on to the rail 8 with its upstand 11 at the leading end. The engagement slot 12 is arranged to be substantially coplanar with the engaging slot of the edge connector 4. When a circuit board 5 is inserted into the edge connector 4, the support element 7 is used to support the edge of the circuit board 5 remote from the edge connector 4. The operating button 15 of the support element 7 is lifted by the operator, to withdraw the head 17 of bolt 16 into the main body 10 of the support element 7. The support element 7 may then be moved along the rail 8 towards the edge of the circuit board 5, so that the edge of the circuit board 5 enters the engagement slot 12 of the upstand 11. The operator then releases the button 15, and the spring 21 urges the bolt 16 downwardly so that the head 17 of the bolt can enter a recess 24 in the rail 8. This engagement between the bolt 16 and the recess 24 effectively prevents any further movement of the support element 7 longitudinally of the rail 8. The upward pressure of the spring 21 on the shoulder 20 of the stepped bore 19 brings the inclined edge regions 14 of the undercut slot 13 into close contact with the inclined surfaces 23 of the rail, and a secure positioning of the support element 7 results. The resilient action of the spring 21 maintains the engagement between the bolt 16 and the recess 24 even if the rail 8 and support element 7 are subjected to mechanical vibration.

Since manufacturers have settled on standard dimensions for expansion cards such as sound cards, graphic cards or the like, the rail 8 may be provided with recesses 24 at predetermined points along its length to correspond with the standard dimensions of circuit boards 5. Alternatively, a regularly or irregularly spaced series of recesses may be provided so that the support element 7 may be fixed in one of a plurality of positions along the rail 8. If the recesses 24 are formed by a drilling or milling operation, then manufacturing cost is reduced by drilling the recesses only at those positions which correspond to the standard dimensions of circuit boards 5.

The rail 8 may be formed from metal such as aluminum by extrusion, and the recesses 24 may be subsequently formed by drilling. Alternatively, the rail 8 may be injection-moulded from suitable plastics material, with the recesses 24 being formed simultaneously in the moulding operation. The pillars 9 which support the rail 8 may be integrally moulded with the rail 8.

The main body 10 and upstand 11 of the support element 7 may be formed as an integral plastics moulding, as may the operating button 15 and the bolt 16. In the embodiment shown, the shank 18 of the bolt 16 is bifurcated and tapered at its upper end, so that the upper end of the shank 18 may pass through a narrow bore in the operating button 15, and thereafter expand to engage an upwardly-facing shoulder in the button 15. Alternatively, the bolt 16 may be fixed to the operating button 15 by other means such as a screw thread, or by solvent or ultrasonic welding. The main body and upstand of the support element 7 may alternatively be machined from metal such as aluminum, and the operating button 15 and bolt 16 may also be formed from metal if desired.

Figure 5:
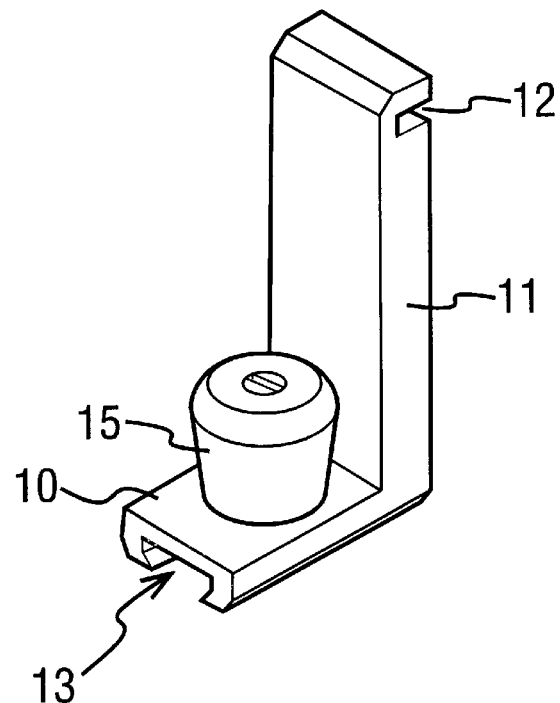
FIGS. 5 and 6 are perspective views of alternative embodiments of the support element.
Figure 6:
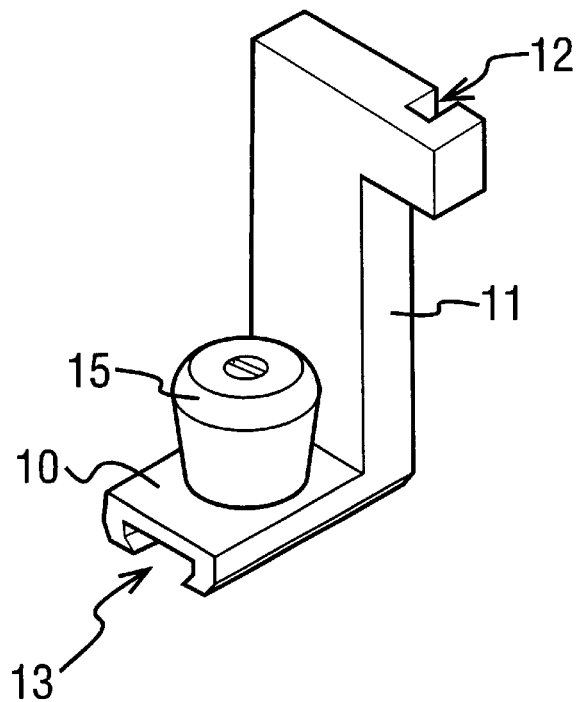

FIGS. 5 and 6 show alternative embodiments of the support element 7. In FIG. 5 a support element 7 is similar to that shown in FIGS. 1 to 4 save that the upstand 11 is elongated to raise the engagement slot 12 significantly above the undercut slot 13.

The embodiment shown in FIG. 6 has a raised upstand 11, in which the engagement slot 12 is oriented vertically rather than horizontally as is the case in FIGS. 1 to 5. The support element of FIG. 6 may be used when the edge connector 4 is mounted to a sidewall of the housing and the support rail 8 is mounted to a further sidewall of the housing which extends substantially perpendicularly to the side wall supporting the edge connector.

It is to be understood that the relative orientations of the engagement slot 12 and the undercut slot 13 of the support element 7 may be arranged so as to suit any relative arrangement of the edge connector 4 and the support rail 8.

Figure 7:
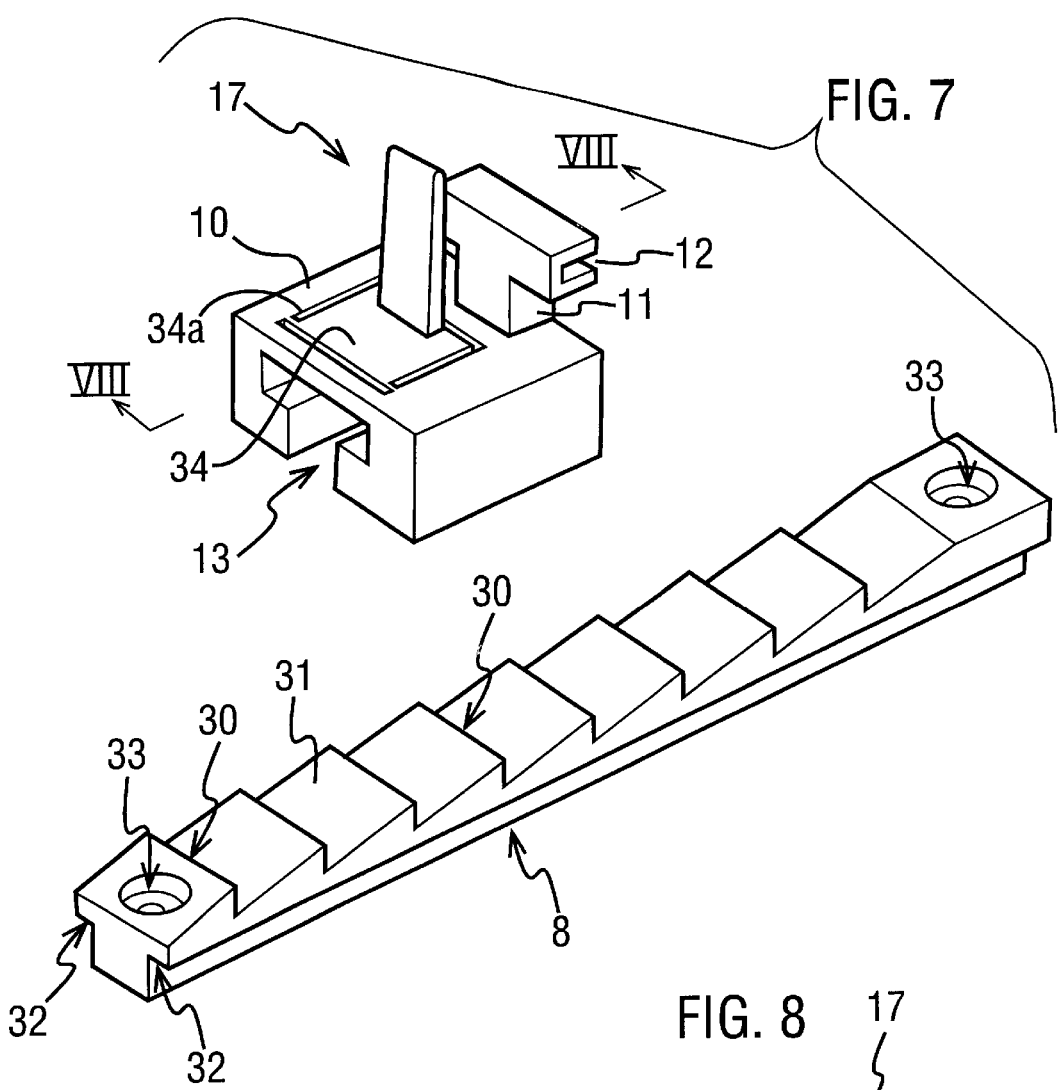
FIG. 7 is a perspective view of an alternative support element and support rail.
Figure 8:
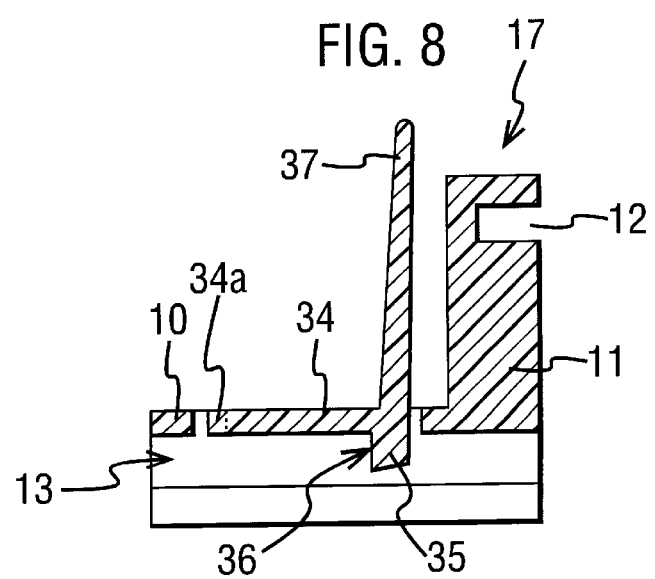
FIG. 8 is a longitudinal sectional view of the support element of FIG. 7, in the plane VIII—VIII.

FIGS. 7 and 8 illustrate an alternative embodiment of the support element 7 and rail 8. In this embodiment, the rail 8 is formed with a series of axially-facing abutment surfaces 30. In the embodiment shown all of the abutment surfaces 30 face in the same direction along the rail 8, and inclined ramp surfaces 31 extend from the lower edge of each abutment surface 30 to the upper edge of its next neighbouring abutment surface. The rail 8 is formed with downwardly-facing undercut surfaces 32, which give the rail and substantially "T" shaped cross-section. Mounting bores 33 are provided at each end of the rail 8 secure the rail 8 to a supporting structure or supporting pillar.

The support element 7 comprises a main body 10, an upstand 11 and an engagement slot 12 as before. An undercut slot 13 extends across the lower surface of the main body 10, the undercut slot 13 corresponding in cross-section to the cross-section of the rail 8 so that the support element 7 may be slid along the rail 8. A flexible web 34 is fixed at one end to the main body 10 via bridges 34A, and has a downwardly extending tooth 35 at its other end. The tooth 35 has an engagement surface 36 extending across the undercut slot 13. An operating lever 37 extends upwardly from the end of the web 34 having the tooth 35.

In operation, the support rail 8 is mounted to a circuit housing so as to extend away from the edge connector 4, with the abutment surfaces 30 facing toward the edge connector 4. The support element 7 is placed at the end of the rail 8 remote from the edge connector, and is advanced onto the rail 8 with the upstand 11 and engagement slot 12 leading. As the tooth 35 contacts the cam surfaces 31 of the rail, the resilient web 34 is deflected upwardly allowing the tooth 35 to ride over the cam surface 31. The resilience of the web then causes the tooth 35 to drop down, so that the engagement surface 36 of the tooth may contact the abutment surface 30 of the rail 8. This engagement prevents retrograde movement of the support element 7.

A circuit board 5 is then mounted to the edge connector 4, and the support element 7 is advanced along the rail 8 until the edge of the circuit board 5 remote from the edge connector 4 enters the engagement slot 12 of the support element. During this movement of the support element 7, the tooth 35 passes over successive ramp surfaces 31. When the circuit board 5 is positioned in the engagement slot 12, the contact between engagement surface 36 of the tooth 35 and abutment surface 30 of the rail 8 prevents any return movement of the support element 7 and thus maintains the engagement of the support element 7 with the circuit board 5. When the circuit board is to be released, the operating lever 37 is moved away from the circuit board 5 so that the web 34 is flexed upwardly, releasing the tooth 35 from the abutment surfaces 30 and allowing reverse movement of the support element 7 back along the rail 8.

The pitch of the support surfaces 30 may be arranged to be less than the depth of the engagement slot 12, so that any dimension of circuit board 5 may be accommodated. Alternatively, abutment surfaces may be provided only at locations on the rail 8 which correspond to standardised dimensions of the circuit board 5.

The rail 8 and support element 7 may be moulded from suitable plastics material, or the rail 8 may be formed from metal as before. The support element 7, if formed from metal, may comprise a number of components with the web 34 being pivotally mounted to the body 10 and resiliently biased by means of a spring.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A support assembly for a circuit board, comprising:
   an elongate support rail having a number of abutment surfaces spaced along the length of the rail and facing in a first longitudinal direction thereof; and
   a support element mountable to the rail for movement along the rail, and comprising an engagement portion for supportingly engaging a circuit board, and a detent having a first position in which the detent is engageable with an abutment surface of the rail to prevent movement of the support element along the rail in a second longitudinal direction opposed to said first longitudinal direction, and a second position in which movement of the support element along the rail in said second longitudinal direction is permitted;
   wherein the support rail further comprises a number of second abutment surfaces facing in said second longitudinal direction and engageable by said detent of said support element in its first position to prevent movement of said support element in said first longitudinal direction;
   wherein the abutment surfaces and second abutment surfaces are formed by a number of holes penetrating the support rail, each hole providing an abutment surface and a second abutment surface.

2. A support assembly according to claim 1, wherein the detent, when in its first position, is engageable with an abutment surface and a second abutment surface simultaneously.

3. A housing for an electronic circuit comprising a support assembly according to claim 1.

4. A housing for an electronic circuit comprising a support rail for a support assembly according to claim 1.

5. A circuit module for a rack-mountable modular electronic circuit comprising an expansion slot for mounting an expansion card in the module, the module further comprising a support assembly for supporting an expansion card and the support assembly comprising:
   an elongate support rail having a number of abutment surfaces spaced along the length of the rail and facing in a first longitudinal direction thereof; and
   a support element mountable to the rail for movement along the rail, and comprising an engagement portion for supportingly engaging a circuit board, and a detent having a first position in which the detent is engageable with an abutment surface of the rail to prevent movement of the support element along the rail, in a second longitudinal direction opposed to said first longitudinal direction, and a second position in which movement of the support element along the rail in said second longitudinal direction is permitted;
   wherein the support rail further comprises a number of second abutment surfaces facing in said second longitudinal direction and engageable by said detent of said support element in its first position to prevent movement of said support element in said first longitudinal direction; and
   wherein the abutment surfaces and second abutment surfaces are formed by a number of holes penetrating the support rail, each hole providing an abutment surface and a second abutment surface.

6. A circuit module according to claim 5, wherein the detent, when in its first position, is engageable with an abutment surface and a second abutment surface simultaneously.

7. A rack-mountable modular electronic circuit comprising a rack and a number of circuit modules supported in said rack, wherein one of the modules comprises an expansion slot for mounting an expansion card in the module, and the module further comprising a support assembly for supporting an expansion card and the support assembly comprising:
   an elongate support rail having a number of abutment surfaces spaced along the length of the rail and facing in a first longitudinal direction thereof; and
   a support element mountable to the rail for movement along the rail, and comprising an engagement portion for supportingly engaging a circuit board, and a detent having a first position in which the detent is engageable with an abutment surface of the rail to prevent movement of the support element along the rail, in a second longitudinal direction opposed to said first longitudinal direction, and a second position in which movement of the support element along the rail in said second longitudinal direction is permitted;
   wherein the support rail further comprises a number of second abutment surfaces facing in said second longitudinal direction and engageable by said detent of said support element in its first position to prevent movement of said support element in said first longitudinal direction; and
   wherein the abutment surfaces and second abutment surfaces are formed by a number of holes penetrating the support rail, each hole providing an abutment surface and a second abutment surface.

* * * * *